United States Patent [19]
Snyder

[11] Patent Number: 6,088,168
[45] Date of Patent: Jul. 11, 2000

[54] LASER DIODE ASSEMBLY INCLUDING A CARRIER-MOUNTED CROSSED PAIR OF CYLINDRICAL MICROLENSES

[75] Inventor: James J. Snyder, Soquel, Calif.

[73] Assignee: Blue Sky Research, San Jose, Calif.

[ * ] Notice: This patent is subject to a terminal disclaimer.

[21] Appl. No.: 09/203,883

[22] Filed: Dec. 1, 1998

Related U.S. Application Data

[63] Continuation of application No. 08/837,004, Apr. 11, 1997, Pat. No. 5,844,723.

[51] Int. Cl.$^7$ .................................................... G02B 13/08
[52] U.S. Cl. ............................................................. 359/668
[58] Field of Search ................................... 359/668, 710; 372/101

[56] References Cited

U.S. PATENT DOCUMENTS

| | | | |
|---|---|---|---|
| 4,253,735 | 3/1981 | Kawamura et al. | 359/668 |
| 5,844,723 | 12/1998 | Snyder | 359/668 |

*Primary Examiner*—Scott J. Sugarman
*Attorney, Agent, or Firm*—LaRiviere, Grubman & Payne LLP

[57] ABSTRACT

Laser diode/cylindrical microlens assembly including a crossed-pair of passively aligned cylindrical microlenses attached to a substrate on which is mounted a laser diode chip. The microlenses are mounted in an "aplanatic" configuration with their flat surfaces facing the emitting facet of the diode, which arrangement provides for passive alignment and possible automated mounting, but requires no additional lenses for astigmatism correction. The crossed pair of lenses can collimate or focus the laser diode beam, for example focusing into a single mode fiber.

2 Claims, 1 Drawing Sheet

LASER DIODE ASSEMBLY INCLUDING A CARRIER-MOUNTED CROSSED PAIR OF CYLINDRICAL MICROLENSES

RELATED APPLICATION

This is a Continuing Patent Application of prior Application Ser. No.: 08/837,004, filed on Apr. 11, 1997, now U.S. Pat. No. 5,844,723. This continuing Application incorporates by reference Application 08/837,004, and contains no new matter. This Application hereby claims priority based on Application number 08/837,004.

TECHNICAL FIELD

The present invention relates to cylindrical microlenses, and more particularly to the use of such lenses with laser diodes.

BACKGROUND OF THE INVENTION

In U.S. Pat. No. 5,181,224, there is disclosed a configuration of cylindrical microlenses in which a "crossed" pair of lenses are used to collimate or focus the beam of a laser diode.

In a paper presented by the present inventor at the July 1993 Proceedings of the Society of Photo-Optical Instrumentation Engineers, entitled "CYLINDRICAL MICRO-OPTICS", there is disclosed such a pair of crossed cylindrical microlenses which are held in spaced relation to each other by a spacer in which the lenses are mounted. Such a spacer is used to attach a pair of microlenses to a laser diode during or after the assembly of the diode form a semiconductor chip, heatsink, and housing.

In U.S. patent application Ser. No. 08/725,151 entitled: "ELECTRO-OPTICAL DEVICE WITH INTEGRAL LENS", there is disclosed a scheme for mounting a long cylindrical microlens to a row of laser diode chips which has been cleaved from a wafer. First, the lens and the diode row are positioned on a substrate. The long lens is then aligned to the diode row by turning on one of the diodes and actively aligning the lens by inspection of the laser beam. The lens and diode are at this point fixed to the substrate to establish their relative position. Then the Lens/diode row is cut into individual diode chips.

The active alignment described in U.S. patent application Ser. No. 08/725,151 entitled: "ELECTRO-OPTICAL DEVICE WITH INTEGRAL LENS", may not be suitable for high volume production. In a U.S. patent application entitled "MULTIPLE ELEMENT LASER DIODE ASSEMBLY INCORPORATING A CYLINDRICAL MICROLENS", filed on Apr. 11, 1997 and identified by Attorney's Docket No. P718, there is described another diode/microlens system in which the microlens does not correct for astigmatism of the diode beam, which is instead corrected downstream with a larger lens or other means. In this system no active alignment is required to position the microlens adjacent to the laser diode facet, so automation of the process is possible. However, other means are then required to correct for the astigmatism of the beam.

It would be desirable to have a laser diode/microlens system in which active alignment of the beam was not required, but in which the addition of a larger lens downstream could also be avoided.

DISCLOSURE OF INVENTION

In accordance with the preferred embodiments, a laser diode/cylindrical microlens assembly is taught in which a crossed-pair of cylindrical microlenses is attached to a substrate on which is mounted a laser diode chip. The microlenses are mounted with their flat surfaces facing the emitting facet of the diode, which arrangement provides for passive alignment and possible automated mounting, but requires no additional lenses for astigmatism correction. The crossed pair of lenses can collimate or focus the laser diode beam, for example focusing into a single mode fiber.

Other features of the present invention are disclosed or apparent in the section entitled "BEST MODE OF CARRYING OUT THE INVENTION".

BRIEF DESCRIPTION OF THE DRAWINGS

For fuller understanding of the present invention, reference is made to the accompanying drawing in the following detailed description of the Best Mode of Carrying Out the Invention. In the drawing.

Figure 1:
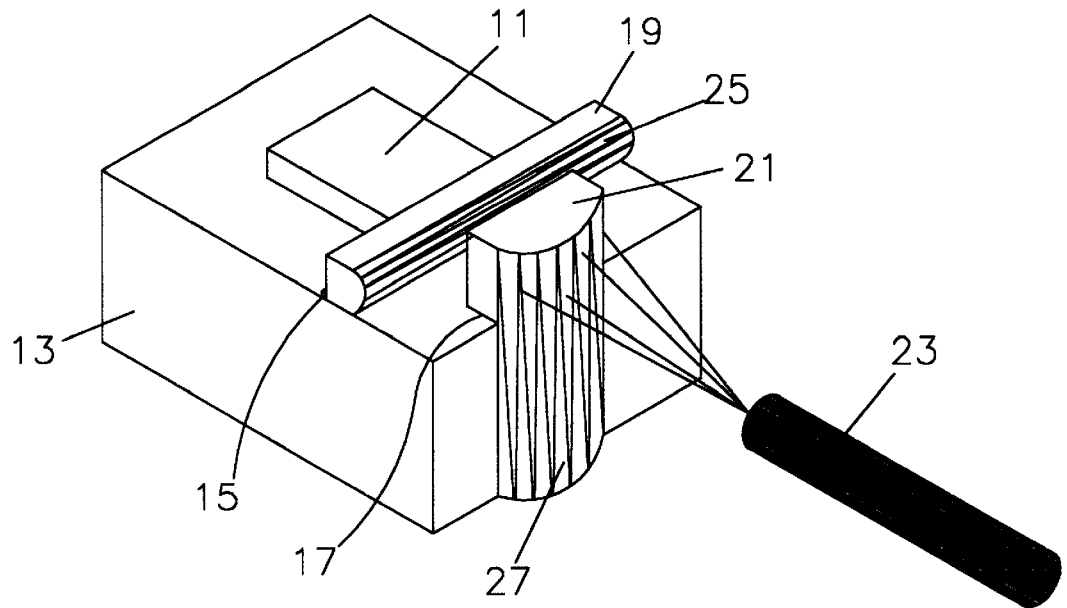
FIG. 1 is front perspective view of an apparatus constructed according to the principles of the present invention.

Reference numbers refer to the same or equivalent parts of the invention throughout the several figures of the drawing.

BEST MODE OF CARRYING OUT THE INVENTION

Figure 2:
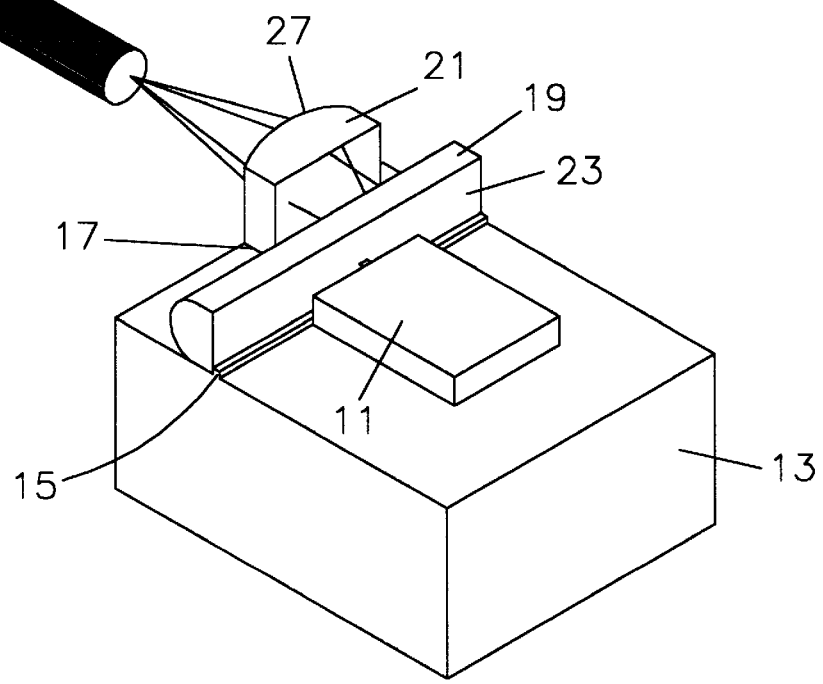
FIG. 2 is rear perspective view of an apparatus constructed according to the principles of the present invention.

Referring now to FIGS. 1 and 2, a laser diode chip 11 is mounted on a substrate 13 e.g. in the manner described in "MULTIPLE ELEMENT LASER DIODE ASSEMBLY INCORPORATING A CYLINDRICAL MICROLENS", filed on Apr. 11, 1997 and identified by Attorney's Docket No. P718. Substrate 13 includes a ridge 15 and a slot 17 in which are positioned cylindrical microlenses 19 and 21 respectively. The microlenses are preferably of the type manufactured by Blue Sky Research, located at 375 Encinal St, Santa Cruz, Calif., and in a preferred mode are described by their relevant parameters as follows:

In one preferred embodiment of the present invention, microlens 19 is a plano-convex cylinder formed of Schott F2 glass, with dimensions of about 0.250 mm in axial thickness (i.e., along the optical axis) by 0.300 mm in width (i.e., perpendicular to the optical axis). The distance from the emitter face (not shown) of laser diode 11 to planar surface 23 of lens 19 is 0.025 mm. The convex, or powered, surface, 25, of microlens 19 is described by the standard "sag" equation:

$$z = \frac{cy^2}{1 + \sqrt{1 - (1+k)c^2 y^2}} + a_2 y^2 + a_4 y^4 + \ldots$$

which defines the distance, z, from a reference plane normal to an axis (in this case the optical axis) as a function of y. The reference plane touches the convex surface at its vertex. There is no sag equation as a function of x, because in the preferred embodiment microlens 121 is a cylindrical lens. In the equation, c is the curvature of the surface, k is the conic constant, and the $a_n$ are the coefficients of the higher order terms. In the preferred embodiment $c = -10.3442$; $k = -0.6759$; $a_4 = 3.3562$; and $a_6 = -148.3135$. The other coefficients $a_n$ are all zero.

Microlens 21 is similarly formed, with differing dimensions and coefficients for the convex, or powered, surface, 27, thereof. In this preferred embodiment, the thickness (along the optical axis) is 0.241 mm, and the width (perpendicular to the optical axis) is 0.200 mm. The coefficients are $c=-7.1559$; $k=-1.1400$; $a_4=6.9018$; and $a_6=-1256.1870$. The other coefficients $a_n$ are all zero.

Each lens is mounted and aligned as substantially described in "MULTIPLE ELEMENT LASER DIODE ASSEMBLY INCORPORATING A CYLINDRICAL MICROLENS", filed on Apr. 11, 1997 and identified by Attorney's Docket No. P718. The alignment in a preferred embodiment is passive in nature, however, some embodiments may benefit from an active alignment of one or more optical elements. In this exemplar, both of the lenses have their flat side toward the emitter, in contradistinction to the configuration taught in the '224 reference and the above-referenced paper entitled "CYLINDRICAL MICRO-OPTICS". The pair of lenses described will focus the beam into a single mode fiber 23, but collimation of the beam, or indeed conversion of the beam from an initial divergence to a final divergence in each axis may be accomplished by suitable design of one or both microlenses.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. The invention disclosed herein may be practiced without any element which is not specifically disclosed herein.

What is claimed is:

1. An optical assembly comprising:
a substrate having mounted thereon a laser source;
a first microlens disposed and passively aligned on said substrate;
a second microlens further disposed and passively aligned on said substrate, said second microlens disposed substantially orthogonal to said first microlens; and
said first microlens and said second microlens being mounted in an aplanatic configuration relative to said laser source.

2. An optical assembly comprising:
a substrate having mounted thereon a laser source;
a first microlens disposed and passively aligned on said substrate;
a second microlens further disposed and passively aligned on said substrate, said second microlens disposed substantially orthogonal to said first microlens; and
at least one of said first microlens and said second microlens being a cylindrical microlens whose optical performance is further characterized by being insensitive to position relative to said laser source.

* * * * *